(12) United States Patent
Mathew

(10) Patent No.: US 9,117,756 B2
(45) Date of Patent: *Aug. 25, 2015

(54) ENCAPSULANT WITH CORROSION INHIBITOR

(75) Inventor: Varughese Mathew, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 403 days.

This patent is subject to a terminal disclaimer.

(21) Appl. No.: 13/361,171

(22) Filed: Jan. 30, 2012

(65) Prior Publication Data

US 2013/0193576 A1 Aug. 1, 2013

(51) Int. Cl.
| | |
|---|---|
| *H01L 23/29* | (2006.01) |
| *H01L 23/28* | (2006.01) |
| *H01L 23/00* | (2006.01) |
| *C08K 5/09* | (2006.01) |

(52) U.S. Cl.
CPC .............. *H01L 23/293* (2013.01); *H01L 24/05* (2013.01); *H01L 2224/02166* (2013.01); *H01L 2224/04042* (2013.01); *H01L 2224/05556* (2013.01); *H01L 2224/45124* (2013.01); *H01L 2224/48463* (2013.01)

(58) Field of Classification Search
None
See application file for complete search history.

(56) References Cited

U.S. PATENT DOCUMENTS

| | | | | |
|---|---|---|---|---|
| 4,617,584 | A * | 10/1986 | Ikeya et al. | 257/793 |
| 6,457,234 | B1 | 10/2002 | Edelstein et al. | |
| 6,779,711 | B2 | 8/2004 | Edelstein et al. | |
| 7,081,680 | B2 | 7/2006 | Edelstein et al. | |
| 8,853,867 | B2 * | 10/2014 | Chopin et al. | 257/787 |
| 2009/0166861 | A1 * | 7/2009 | Lehr et al. | 257/737 |
| 2011/0068480 | A1 * | 3/2011 | Hayashi et al. | 257/777 |
| 2012/0273954 | A1 * | 11/2012 | Higgins, III | 257/762 |
| 2014/0145339 | A1 * | 5/2014 | Chopin et al. | 257/762 |

OTHER PUBLICATIONS

Silverman et al.; "Potential-pH (Pourbaix) Diagrams as Aids for Screening Corrosion Inhibitors and Sequestering Agents"; Corrosion—The Journal of Science and Engineering; 2010; 12 Pgs.; vol. 66, No. 5; NACE International.

Xu et al. "Growth of Intermetallic Compounds in Thermosonic Copper Wire Bonding on Aluminum Metallization"; Journal of Electronic Materials; 2010; pp. 124-131; vol. 39, No. 1; TMS.

* cited by examiner

*Primary Examiner* — Michael J Feely

(57) ABSTRACT

A packaged electronic device including an electronic device, a conductive structure, and an encapsulant. The encapsulant has chlorides and a negatively-charged corrosion inhibitor for preventing corrosion of the conductive structure.

18 Claims, 4 Drawing Sheets

ENCAPSULANT WITH CORROSION INHIBITOR

BACKGROUND OF THE INVENTION

1. Field of the Invention

This invention relates to packaged electronic devices.

2. Description of the Related Art a

Electronic devices such as semiconductor devices can be encapsulated in an encapsulant such as a mold compound. One problem with such packaged electronic devices is that corrosive substances such as chloride ions in presence of moisture in the encapsulant can attack certain metals that are susceptible to corrosion. One way to reduce the corrosion is to reduce the amount of the corrosive substance in the encapsulant such as reducing the amount of chloride.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

It has been discovered that including negatively charged corrosion inhibitors in an encapsulant for a packaged electronic device may inhibit corrosion in wire bond pads of the electronic device. In one example, the negatively charged corrosion inhibitors are attracted to positively charged structures of the electronic device wherein the attracted corrosion inhibitors prevent other corrosive substances from causing corrosion of susceptible surfaces of the positively charge structures.

Figure 1:
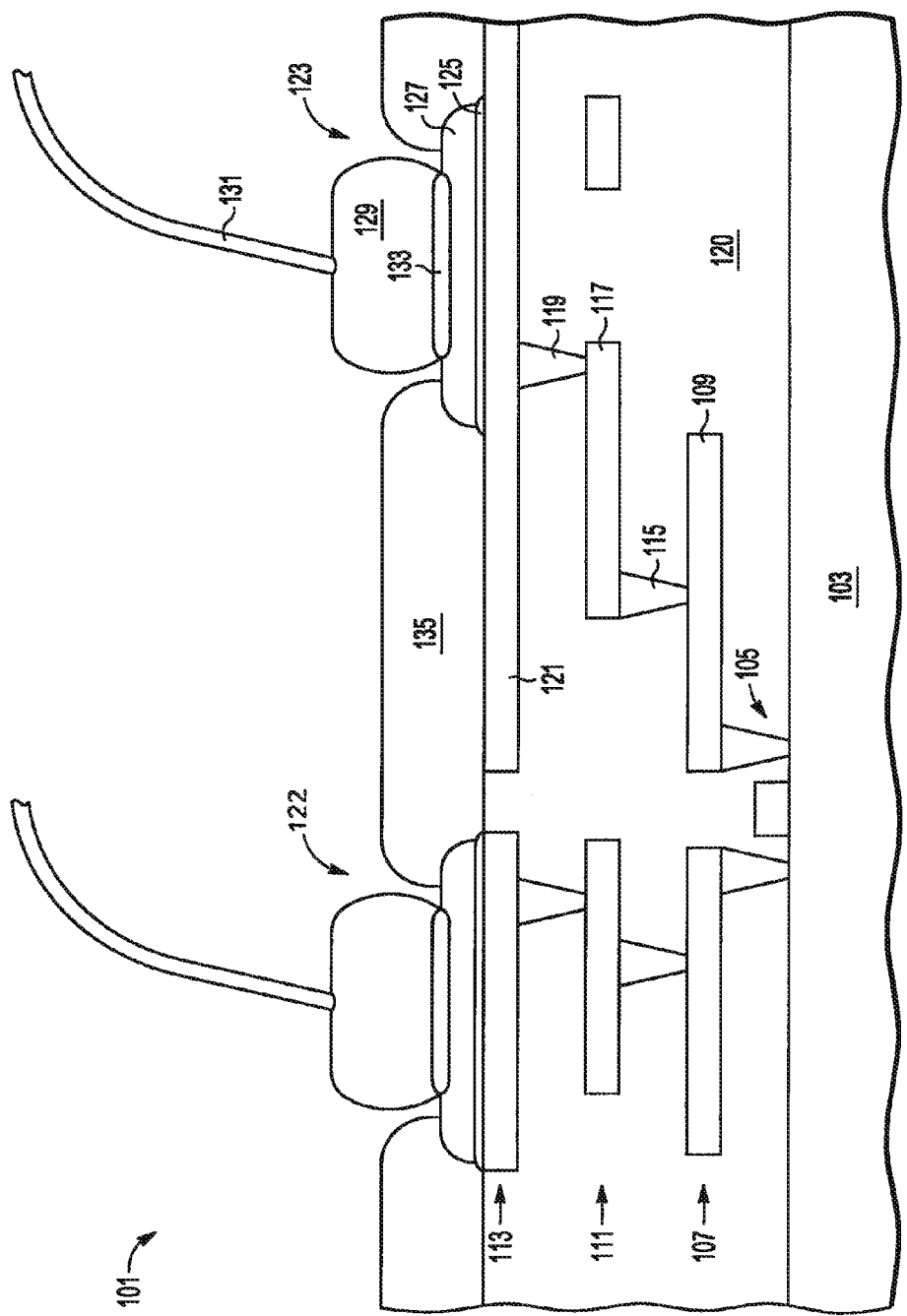
FIGS. 1 and 2 set forth partial cut away side views of a packaged electronic device in various stages of its manufacture according to one embodiment of the present invention.

FIG. 1 is a partial cutaway cross-section of an electronic device where wires are wire bonded to conductive bond pads. In the embodiment of FIG. 1, electronic device is an integrated circuit 101 that includes multiple transistors (e.g. 105) and/or other types of semiconductor devices (e.g. diodes (not shown)) implemented in a semiconductor material (e.g. semiconductor substrate 103). In one example, transistor 105 is a CMOS transistor implemented in silicon substrate 103. However, in other embodiments, an integrated circuit may include other types semiconductor devices and/or have other configurations.

In the embodiment shown, the semiconductor devices of integrated circuit 101 are electrically coupled together by conductive interconnect structures located in one or more interconnect layers (107, 111, and 113). The conductive interconnect structures (e.g. 109, 117, and 121) of the interconnect layers are coupled to other conductive interconnect structures of other interconnect layers with conductive vias (e.g. 115, 119) or conductive plugs. The conductive interconnect structures and vias are made of a conductive material (e.g. copper, gold, aluminum, titanium). The conductive interconnect structures may include diffusions layers and barrier layers. The conductive structures are located in interlayer dielectric material 120 (e.g. an oxide formed by a TEOS process or other types of dielectric materials) to isolate the electrically conductive structures. In one embodiment, the conductive interconnect layers and dielectric material are sequentially formed in layers over substrate 103 from the bottom of the page to the top of the page.

In the embodiment shown, wire bond pads 122 and 123 are formed on interconnects structures (e.g. 121) of the final interconnect layer 113. In one embodiment where interconnects of the final interconnect layer 113 are made of copper, a diffusion barrier 125 (e.g. tantalum) is formed on the copper wherein an aluminium bond pad layer 127 is formed on the diffusion barrier 125. Afterwards, a passivation layer 135 of a dielectric material is formed over integrated circuit 101 to electrically isolate and protect integrated circuit 101. Openings are made in passivation layer 135 to expose the bond pad layers (e.g. 127).

After the formation of passivation layer 135, the wafer on which integrated circuit 101 is formed is then singulated into multiple integrated circuits. Those integrated circuits maybe mounted on structures such as substrates or lead frames.

After the integrated circuit is mounted to a substrate or lead frame, wires (131) are attached by a wire bonding process to bond pads (122, 123) with a wire bonding material (e.g. ball bond 129). Wire 131 and bonding material (ball bond 129) form a wire bond. The other end of the wires 131 are attached to a conductive structure of the substrates or lead frame (not shown) with e.g. a stitch bond. Although in the embodiment shown, wire 131 is attached to a bond pad of integrated circuit 101 with a ball bonding wire bond process, wires 131 may be attached to a bond pad by other wire bonding techniques e.g. such as stitch bonding or wedge bonding.

In one embodiment where the conductive ball bonding material of ball bond 129 is copper (e.g. is greater than 95% copper) and pad layer 127 is aluminum (e.g. greater than 95% aluminum), a multiphase material layer 133 of intermetallic compounds of aluminum and copper form at the interface of layer 127 and bonding material of ball bond 129, as a result of wire bonding or subsequent thermal process such as e.g. a die attach curing process or testing process. This multiphase material layer 133 may be susceptible to corrosion from corrosive substances in a subsequently formed encapsulant. In some embodiments, the material of layer 133 may be "copper rich" at the top and aluminum rich at the bottom of layer 133. In some embodiments, corrosion inhibitors and/or diffusion barrier layers of other material such as e.g. a stack layer of Nickel/Palladium/Gold may be applied to layer 127 prior to wire bonding. In other embodiments, ball bond 129 and layer 127 each may be made of other materials (e.g. copper, aluminum, gold, metal alloys) in other embodiments.

Figure 2:
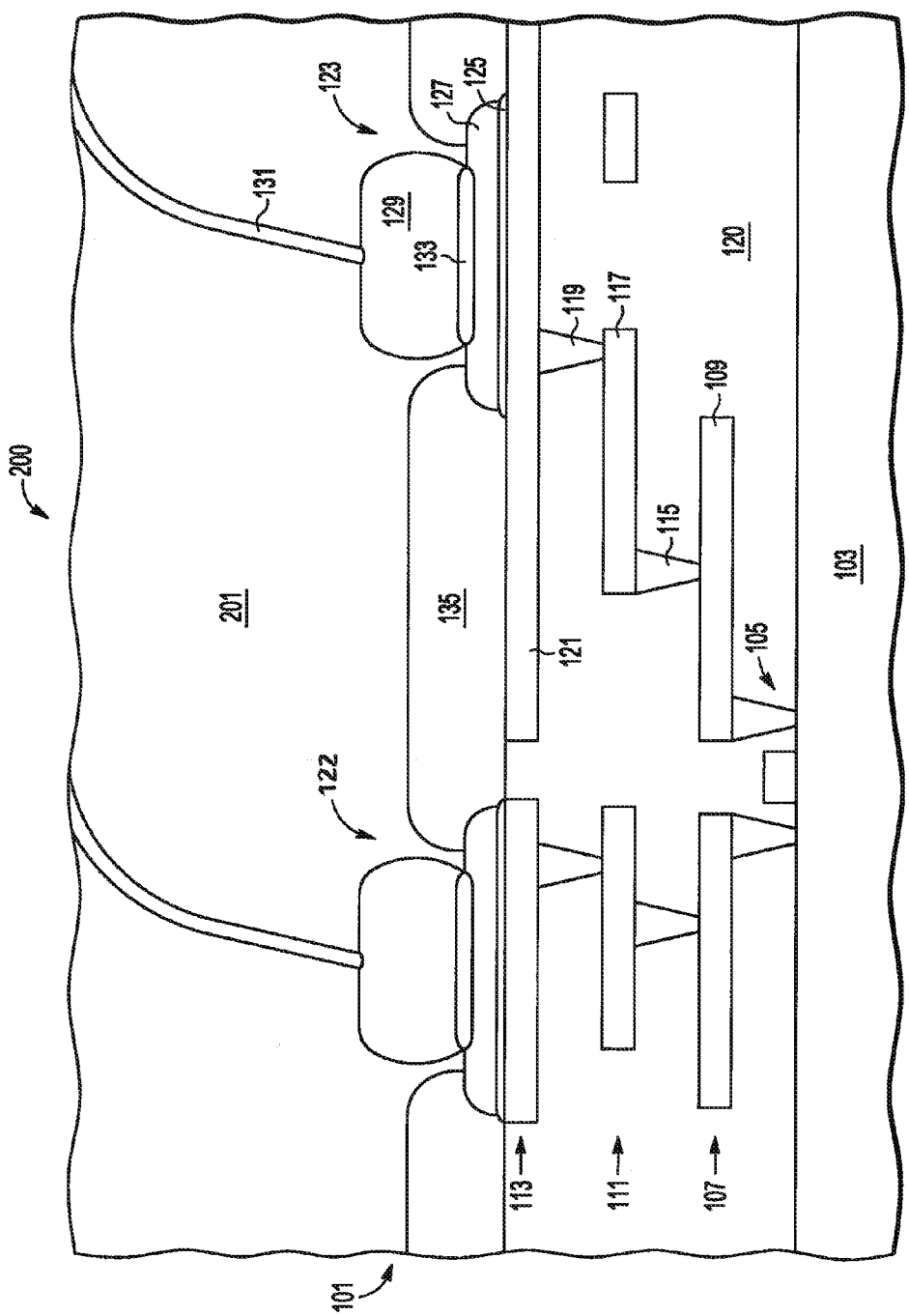

FIG. 2 shows a portion of packaged electronic device 200 after integrated circuit 101, wires 131, and the substrate or leadframe (not shown) are encapsulated with an encapsulant 201. In one embodiment, encapsulant 201 is applied to the integrated circuit by a transfer molding process, but may be applied by other encapsulating processes e.g. such as a center gate molding process or injection molding process in other embodiments. In some embodiments, the encapsulated packages may be encapsulated in panels and then separated into the individual packages.

In one embodiment, encapsulant 201 is made of molding compound. In one example, the molding compound includes silica fillers (70-80% by volume), an epoxy resin (10-20% by volume), hardeners (5-10% by volume), and flame retardants (1-4% by volume). Encapsulant 201 may also include materials such as stress release agents, catalyst accelerators, carbon black, release agents, and coloring agents. However, in other embodiments, an encapsulant may include different materials, a different combination of materials, and/or have a different percentage of materials.

Figure 3:
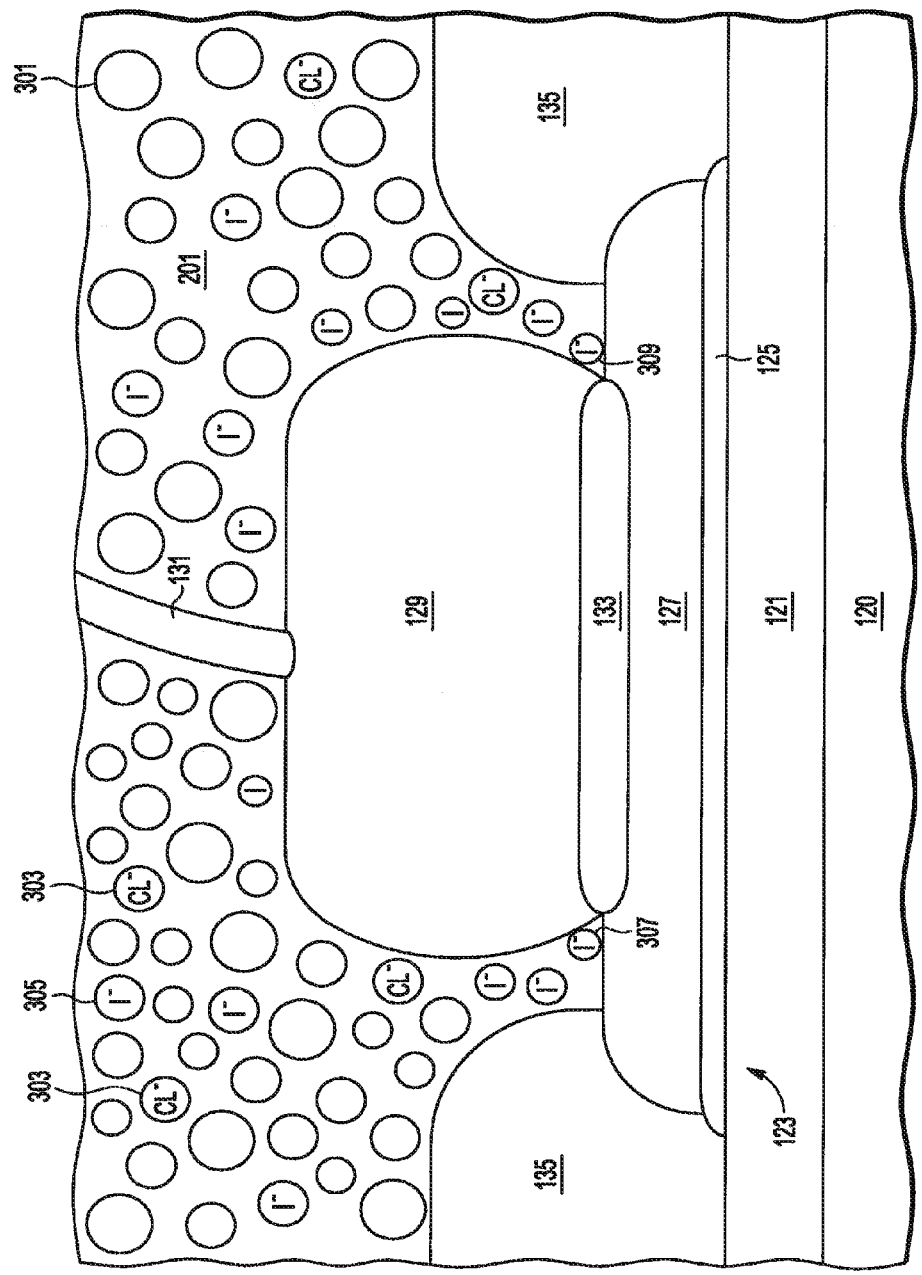
FIG. 3 shows a portion of the packaged electronic device of FIG. 2 according to one embodiment of the present invention.

FIG. 3 is a more detailed view of pad 123 that is shown in FIG. 2. In the view of FIG. 3, individual particles located in the encapsulant 201 are shown for illustrative purposes and are not drawn to scale. FIG. 3 shows silica particles 301 distributed throughout encapsulant 201.

Also shown distributed in encapsulant 201 are negatively charged chloride ions 303. These chloride ions ($Cl^-$) may be generated from the different components of the encapsulant. Mold compounds absorb moisture (e.g. moisture content 0.1-0.5%) that with ionic impurities such as chloride can form electrolytes capable of causing corrosion to structures involving metals. Susceptibility of corrosion for metals vary from metal to metal and governed by thermodynamic and kinetic principles. For example, chloride ions 303 may cause corrosion in multiphase material layer 133 in that layer 133 is susceptible to corrosion. It is reported that among the various structures involved in copper-Al wire bonding (wire 131, ball bond 129, layer 133, layer 127), Cu—Al intermetallic compounds (IMC) in layer 133 are easily corroded. In one embodiment, among the various IMC (133) compounds, the one which is close to copper ball bond 129 is more susceptible for corrosion. However under appropriate aggressive conditions CI can also attack other metals like aluminum and copper.

During the operation of integrated circuit, some bond pads (e.g. bond pad 123) may be biased at a positive voltage (e.g. 2.2 V, 4 V, or 5 V), such as bond pads that are designed to supply integrated circuit 101 with a positive supply voltage (VDD). Being biased at a positive voltage, conductive structures that are adjacent to the encapsulant attract and cause to migrate the negative charged ions such as chloride ions 303 towards such positively based structures or pins. The buildup of the chloride ions at the positively charged conductive structures can cause corrosion of the materials that are susceptible to corrosion. For example, chloride ions that are attracted to a positively charged bond pad 123 and material of ball bond 129, may cause corrosion of multiphase material layer 133. Such corrosion may lead to an increased resistance or to a complete open of the bond pad/wire bond connection of a positively charged bond pad.

To inhibit the corrosion from the negatively charged chloride ions and from other corrosive substances of the encapsulant, encapsulant 201 is formed to include negatively charged corrosion inhibitors. In the embodiment shown, the corrosion inhibitors are particles labeled "I". In one embodiment, these corrosion inhibitors (305, 307, 309) are negatively charged ions or capable of forming charged ions that are attracted to positively charged structures of the bond pad and wire bond. The corrosion inhibitor ions migrate towards the positively charged structures and are believed to be adsorbed to active sites on the surfaces that have a potential for corrosion. The adsorption of the negatively charge corrosion inhibitor ions (307, 309) on such surfaces inhibits the corrosion caused by chloride ions on those surfaces.

In one embodiment, the number of inhibitor ions is greater than the number of chloride ions such that an inhibitor ion is more likely to be absorbed to a positively charged structure than a chloride ion. In one example, the number of inhibitor ions in the encapsulant is at least twice as many as the number of chloride ions. In some embodiments, higher ratios of inhibitor ions to chloride ions is preferable (e.g. 5 or greater inhibitor ions to 1 chloride ion or greater) in that it provides a greater number of inhibitor ions to be adsorbed to the susceptible structures. In one embodiment, the number of negatively charged inhibitor ions is 150 parts per million (ppm) or greater. In other embodiments, number of inhibitor ions may be around 200 ppm. In some embodiment, the concentration of inhibitor ions added to an encapsulant is dependent on the number of chloride ions in the encapsulant.

Figure 4:
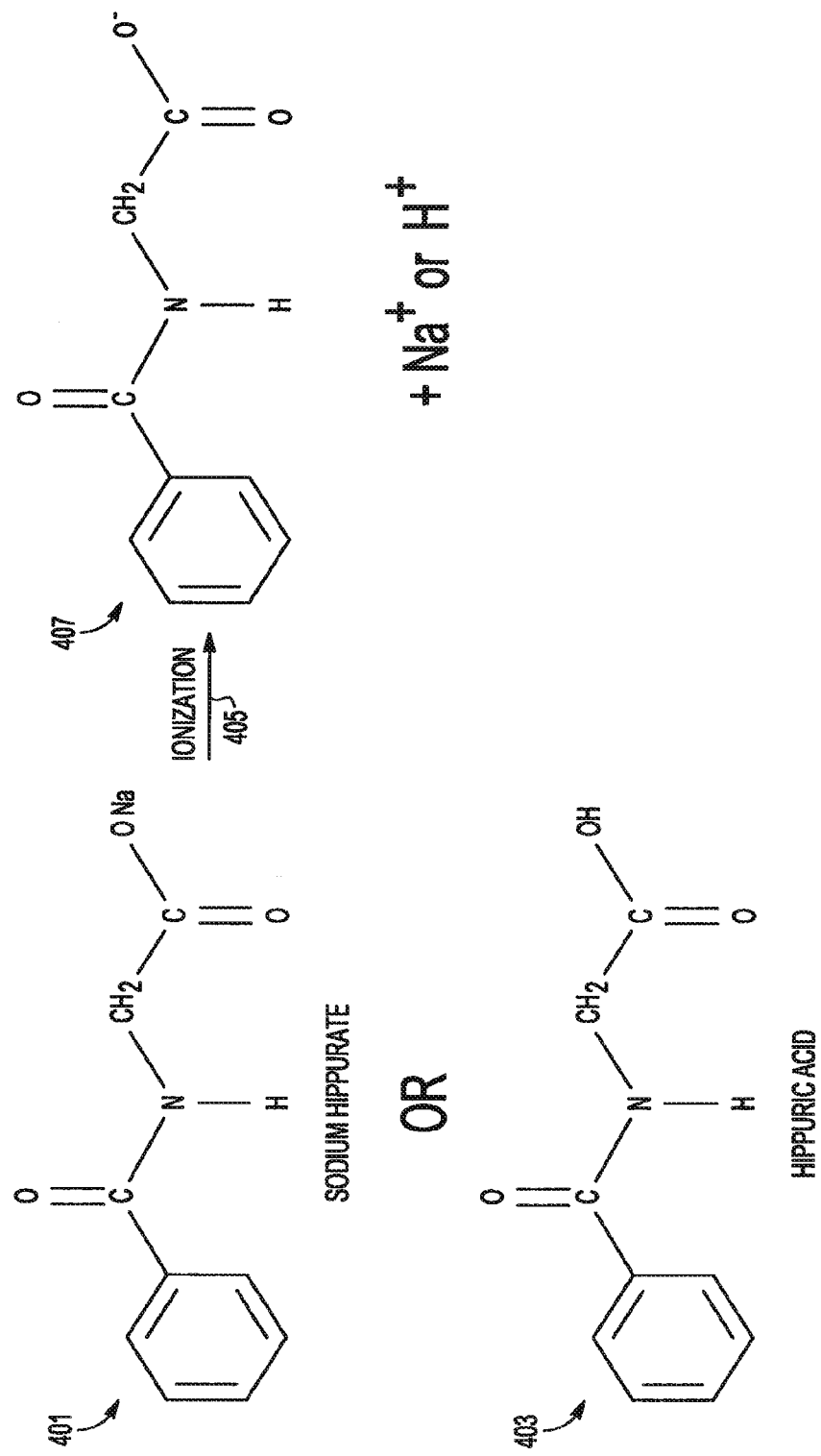
FIG. 4 shows models of corrosion inhibitor ions according to two embodiments of the present invention.

FIG. 4 shows two embodiments of the formation of corrosion inhibitors from an ionization process. Molecular diagram 401 represents a molecule of sodium hippurate. Molecular diagram 403 represents a molecule of hippuric acid. In one embodiment, either one of the substances may be added to an encapsulant before the encapsulating process. In the presence of moisture and appropriate pH conditions, these molecules ionize to form negatively charged hippurate ions 407, which act as corrosion inhibitors in the encapsulant. Alternately other soluble salts (e.g. potassium or ammonium hippurate) can be added to the encapsulant prior to encapsulation. The potassium hippurate or ammonium hippurate ionizes to form negatively charged hippurate ions which act as a corrosion inhibitor.

In other embodiments, other substances may be used as a corrosion inhibitor. In one embodiment, 1-Hydroxyethylidene-1,1-Diphosphonic Acid (HEDP) may be added to encapsulant 201 prior to encapsulation which ionizes to form negatively charged ions (anions). Other types of inhibitors that may be used include negative ions of organic acids such as acetates, formates, and tartarates and negative ions of inorganic acids such as phosphates, silicates and nitrites. In some embodiments, salts which can form the negatively charged ions may be added directly to the encapsulant prior to encapsulation. These substances can also be added as mixtures. In some embodiments, an encapsulant may include multiple types of corrosion inhibitors, such as anions of both organic and inorganic acids.

Adding negatively charge corrosion inhibitors to the encapsulant may inhibit the corrosive effect of chloride ions on conductive structures such as on intermetallic compounds formed between bonding metals such as copper and Al which can positively charged during the operation and/or testing of the packaged device. In one embodiment, the corrosion inhibitors are adsorbed to the susceptible surfaces to prevent negatively charged ions from attacking those surfaces. In some embodiments, the substances that form the negatively charged ion inhibitors may be applied to the bond pads prior to wire bonding.

Although the packaged electronic device is shown to include an integrated circuit, packages electronic devices may include other types of electronic devices (e.g. capacitors, inductors) in other embodiments. In some embodiments, a packaged electronic device may include multiple electronic devices coupled together. Furthermore, an encapsulated integrated circuit may have other configurations/structures in other embodiments, e.g. such as underfill encapsulating materials used in flip chip applications.

In one embodiment, a packaged electronic device includes an electronic device, a conductive structure, an encapsulant encapsulating the conductive structure. The encapsulant includes chlorides and a negatively-charged corrosion inhibitor.

In another embodiment, a method of making a packaged electronic device includes providing an electronic device and a conductive structure electrically coupled to the electronic device and applying an encapsulant to the conductive structure. The encapsulant includes chlorides and a negatively-charged corrosion inhibitor.

In another embodiment, a packaged electronic device includes an electronic device including a bond pad having an upper surface comprising aluminum, a wire bond including a copper ball bond attached to the bond pad so as to have an intermetallic layer of copper and aluminum between the bond pad and the wire bond, the wire bond including a wire, and an encapsulant encapsulating the wire bond. The encapsulant includes chlorides and a negatively-charged corrosion inhibitor.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A packaged electronic device, comprising:
   an electronic device;
   a conductive structure;
   an encapsulant encapsulating the conductive structure, wherein the encapsulant includes chlorides and a negatively-charged corrosion inhibitor, wherein the negatively charged inhibitor includes at least one negative ion selected from the group consisting of negative acetate ions, negative formate ions, negative tartarate ions, and negative nitrite ions, at a concentration of at least 150 parts per million of the encapsulant.

2. The packaged electronic device of claim 1, wherein the negatively-charged corrosion inhibitor has a concentration of at least five times that of a concentration of the chlorides in the encapsulant.

3. The packaged electronic device of claim 1 wherein the electronic device includes a bond pad and the conductive structure includes a wire bond, the wire bond includes conductive bonding material attached to the bond pad and a wire extending from the conductive bonding material.

4. The packaged electronic device of claim 3, wherein an intermetallic layer comprising copper and aluminum is formed between the bond pad and the conductive bonding material.

5. The packaged electronic device of claim 4, wherein a concentration of the negatively-charged corrosion inhibitor is sufficient to prevent corrosion of the intermetallic layer by the chlorides when the conductive bonding material and bond pad are positively charged.

6. The packaged electronic device of claim 1 wherein the negatively charged inhibitor includes negative nitrite ions at a concentration of at least 150 parts per million of the encapsulant.

7. The packaged electronic device of claim 1 wherein the negatively charged inhibitor includes negative acetate ions at a concentration of at least 150 parts per million of the encapsulant.

8. The packaged electronic device of claim 1 wherein the negatively charged inhibitor includes negative formate ions at a concentration of at least 150 parts per million of the encapsulant.

9. The packaged electronic device of claim 1 wherein the negatively charged inhibitor includes negative tartarate ions at a concentration of at least 150 parts per million of the encapsulant.

10. A packaged electronic device, comprising:
    an electronic device including a bond pad having an upper surface comprising aluminum;
    a wire bond including a copper ball bond attached to the bond pad so as to have an intermetallic layer of copper and aluminum between the bond pad and the wire bond, the wire bond including a wire;
    an encapsulant encapsulating the wire bond, wherein the encapsulant includes chlorides and a negatively-charged corrosion inhibitor, wherein the negatively charged inhibitor includes at least one negative ion selected from the group consisting of negative acetate ions, negative formate ions, negative tartarate ions, and negative nitrite ions, at a concentration of at least 150 parts per million of the encapsulant.

11. The packaged electronic device of claim 10 wherein the negatively charged inhibitor includes negative nitrite ions at a concentration of at least 150 parts per million of the encapsulant.

12. The packaged electronic device of claim 10 wherein the negatively charged inhibitor includes negative acetate ions at a concentration of at least 150 parts per million of the encapsulant.

13. The packaged electronic device of claim 10 wherein the negatively charged inhibitor includes negative formate ions at a concentration of at least 150 parts per million of the encapsulant.

14. The packaged electronic device of claim 10 wherein the negatively charged inhibitor includes negative tartarate ions at a concentration of at least 150 parts per million of the encapsulant.

15. A packaged electronic device, comprising:
    an electronic device including a bond pad having an upper surface comprising aluminum;
    a wire bond including a copper ball bond attached to the bond pad so as to have an intermetallic layer of copper and aluminum between the bond pad and the wire bond, the wire bond including a wire;
    an encapsulant encapsulating the wire bond, wherein the encapsulant includes chlorides and a negatively-charged corrosion inhibitor, wherein the negatively-charged corrosion inhibitor comprises negative hippurate ions.

16. The packaged device of claim 15, wherein the negative hippurate ions have a concentration of at least 150 parts per million of the encapsulant.

17. The packaged electronic device of claim 15, wherein the negative hippurate ions have a concentration of at least five times that of a concentration of the chlorides in the encapsulant.

18. The packaged electronic device of claim 15, wherein a concentration of the negative hippurate ions is sufficient to prevent corrosion of the intermetallic layer by the chlorides when the conductive bonding material and bond pad are positively charged.

* * * * *